United States Patent [19]

Kadomura

[11] Patent Number: 5,391,244
[45] Date of Patent: Feb. 21, 1995

[54] DRY ETCHING METHOD
[75] Inventor: Shingo Kadomura, Kanagawa, Japan
[73] Assignee: Sony Corporation, Tokyo, Japan
[21] Appl. No.: 13,325
[22] Filed: Feb. 4, 1993
[30] Foreign Application Priority Data Feb. 14, 1992 [JP] Japan .................. 4-059106

[51] Int. Cl.$^6$ ............................................. H01L 21/00
[52] U.S. Cl. ..................................... 156/662; 156/643; 156/646; 156/656; 156/657; 156/659.1
[58] Field of Search ............... 156/643, 646, 662, 656, 156/657, 655, 659.1, 661.1, 651, 653

[56] References Cited

U.S. PATENT DOCUMENTS

| | | | |
|---|---|---|---|
| 4,465,552 | 8/1984 | Boffio et al. | 156/643 |
| 4,579,623 | 4/1986 | Suzuki et al. | 156/643 |
| 4,992,136 | 2/1991 | Tachi et al. | 156/643 |

FOREIGN PATENT DOCUMENTS

| | | |
|---|---|---|
| 61-220432 | 9/1986 | Japan . |
| 01008628 | 1/1989 | Japan . |
| 61166539 | 6/1989 | Japan . |
| 02039428 | 2/1990 | Japan . |
| 3-215938 | 9/1991 | Japan . |

OTHER PUBLICATIONS

"The Merck Index"; Windholz et al.; 10th ed.; 1983; pp. 1287–1288.
"Determination of the Vapor Pressure and Vaporization Coefficient of Polymeric Sulfur Nitride; $(SN)_x$"; 1977; (abstract only); Inorganic Chem. 16(12); Weber et al.
"DC Plasma Etching of Silicon by Sulfer Hexafluoride, Mass Spectrometric Study of Discharge Products"; Wagner et al.; 1981; pp. 201–214.
Abstract #9a-ZF-6, Extended Abstract of the 52nd Fall Meeting of the Japan Society of Applied Physics and Related Societies, 1991, p. 508.
Abstract #28a-G-2, Extended Abstract of the 35th Spring Meeting of the Japan Society of Applied Physics and Related Societies, 1988, p. 495.
K. Tateiwa et al "Etching Characteristics of Plasma CVD Polymers", 1988 Dry Process Symposium, II–8, pp. 74–78.
Semiconductor World, Jan. 1990, pp. 81–84.
Semiconductor World, Jan. 1993, pp. 140–144.

Primary Examiner—Nam Nguyen
Assistant Examiner—George Goudreau
Attorney, Agent, or Firm—Hill, Steadman & Simpson

[57] ABSTRACT

A dry etching method for performing one-stage anisotropic etching of a W-polycide film without using a CFC (chlorofluorocarbon) gas is disclosed. The W-polycide film on a substrate is etched by using sulfur halide such as $S_2Cl_2$ and $S_2Br_2$ for an etching gas while heating the substrate within a temperature range of up to 90° C. Free S released from the sulfur halide is deposited on the substrate within the temperature range, thereby contributing to improvement of selectivity and anisotropy, and $Cl^*$ and $Br^*$ become etchants. Although $WCl_x$ and $WBr_x$, which are etching reaction products, have low vapor pressure at a normal temperature and under normal pressure, $WCl_x$ and $WBr_x$ may be eliminated sufficiently under reduced pressure and heated conditions. Since $F^*$ is not formed in a plasma, no undercut is generated on an underlying polysilicon layer. Also, since C does not exist, particle pollution can be prevented and selectivity for a gate oxide film can be improved. If a nitrogen based compound, such as $N_2$, is added to the sulfur halide, deposition of sulfur nitride based compounds can be expected, and the wafer heating temperature can be raised up to 130° C.

27 Claims, 3 Drawing Sheets

DRY ETCHING METHOD

BACKGROUND OF THE INVENTION

This invention relates to a dry etching method employed in such applications as production of semiconductor devices, and more particularly to a dry etching method for etching a polycide film whereby high selectivity, high anisotropy and low pollution can be achieved without using a chlorofluorocarbon (CFC) gas.

A polycide film formed by stacking a polysilicon layer and a refractory metal silicide layer composed of a tungsten silicide or $WSi_x$, for example, has been used broadly for recent years as a gate metallization material for LSI, because the polycide film exhibits resistance smaller than a single-layer film of a polysilicon by one order of magnitude for an identical cross-sectional area.

Since anisotropy should be realized for two different materials, the polycide film has brought about a new type of difficulty to the dry etching technique. That is, defects such as undercuts and constrictions tend to be generated on a pattern, because the lower layer or the polysilicon layer is etched faster than the upper layer or the refractory metal silicide layer due to the difference in vapor pressure of a resultant halogen compound, and because a reaction layer is formed on the boundary surface between the polysilicon layer and the refractory metal silicide layer. These etching defects cause generation of an offset region where impurities are not introduced at the time of ion implantation for generating source; and drain regions, and a reduction in dimensional precision at the time of forming sidewalls for realizing an LDD structure, and therefore, are unallowable particularly in a submicron device. Accordingly, a lot of research for realization of anisotropic processing for the polycide film is under way.

Conventionally, a chlorofluorocarbon or CFC gas typified by CFC-113 ($C_2Cl_3F_3$) has been used broadly as an etching gas for the polycide film for the following reasons. F and Cl atoms in each molecule promote both a radical reaction and an ion assisted reaction, and deposited carbonaceous polymers perform sidewall protection, thereby making it possible to carry out anisotropic etching with a high etchrate.

However, since the CFC gas is pointed out as a cause of destruction of the earth's ozone layer, as commonly known, there is a pressing need to find appropriate alternative substances to the CFC gas and effective applications thereof.

As a CFC-free measure, the present applicant proposed, in the Japanese patent gazette, KOKAI TOKKYO KOHO No. 3-215938, a two-stage etching technique for etching a $WSi_x$ layer on the upper side of a tungsten polycide film, referred to as a W-polycide film hereinafter, by using HBr/SF$_6$ mixed gas, while etching a polysilicon layer on the lower side by using HBr gas alone. This technique has significant advantages such as capability of achieving a practical etchrate, high anisotropy and high selectivity for a gate oxide film while preventing particle pollution due to $WBr_x$ or tungsten bromide.

Another CFC-free measure is a method of etching a W-polycide film by using $Cl_2/CH_2F_2$ mixed gas instead of CFC-113, which is reported in the Extended Abstract of the 52nd Fall Meeting of the Japan Society of Applied Physics and Related Societies, 1991, p. 508, 9a-ZF-6. With this gas system, sidewall protection is performed by depositing carbonaceous polymers formed in the gaseous phase from $CH_2F_2$. Also, if the flow rate of $CH_2F_2$ is optimized, selectivity between the $WSi_x$ layer and the polysilicon layer can be increased, and residues on steps can be reduced.

Meanwhile, a method for achieving high anisotropy by reducing the temperature of a substrate to be etched (wafer) instead of providing sidewall protection effects by using the carbonaceous polymer has been proposed. This method, so-called low-temperature etching, is designed to keep the wafer at a temperature below 0° C., thereby maintaining an etchrate in the direction of depth at a practical level with the assistance of ions while freezing or inhibiting a radical reaction on the sidewalls of patterns and preventing such etching defects as undercuts. A typical example of this method is reported in the Extended Abstract of the 35th Spring Meeting of the Japan Society of Applied Physics and Related Societies, 1988, p. 495, 28a-G-2, wherein a silicon trench and an n+ type polysilicon layer are etched by using an $SF_6$ gas with a wafer cooled to $-130°$ C.

Although CFC-free measures have been thus proposed, problems remain to be solved for each of these measures.

For instance, practicality of the two-stage etching technique by using a HBr/SF$_2$ mixed gas and a single HBr gas depends upon how precisely the timing for a change of gas composition between the $WSi_x$ layer and the polysilicon layer can be decided. If the timing for the change is too early, the remaining $WSi_x$ layer reacts with the single-composition HBr gas thereby forming $WBr_x$ of low vapor pressure, and therefore, deterioration of the particle level is very likely to take place. On the contrary, if the timing for the change is delayed, undercuts will be generated on the polysilicon layer by F*.

Besides, these days there are cases in which the polycide film must be etched on a substrate having large steps, as seen in bit line processing for SRAM or a transfer electrode forming process for CCD. In these cases, the decision on the timing is more difficult.

On the other hand, the method using the $Cl_2/CH_2F_2$ mixed gas has a problem of excessive deposition of $CH_2F_2$. It is reported in the Extended Abstract of the Dry Process Symposium, 1988, p. 74, II-8, that a $CH_2F_2$ gas forms relatively rigid polymers compared with $C_4F_8$, $C_2Cl_2F_4$ (CFC-114), and $CCl_4$ gases, has a low etchrate by incident ions. Accordingly, the use of $CH_2F_2$ is likely to deteriorate reproducibility and the particle level.

In addition, carbon existing in the etching reaction system deteriorates selectivity for $SiO_2$ based material layers. This problem is pointed out, for instance, in the Monthly Journal "Semiconductor World," published by the Press Journal Inc., January 1990, p. 81–84. In this case, when the carbon is adsorbed on the surface of an $SiO_2$ based material layer like a gate oxide film, a C—O bond with a high bond energy (257 kcal/mole) is formed, thereby weakening an Si—O bond or reducing $SiO_2$ to Si and making it more likely to be extracted by a halogenous etchant. This problem becomes particularly serious in performing a gate processing on a thin gate oxide film.

On the other hand, a low-temperature etching is expected to be one of promising CFC-free etching methods. However, if this method attempts to achieve high anisotropy only by freezing or inhibiting a radical reaction, a substrate to be etched (wafer) needs to be cooled to such a degree as to require liquid nitrogen. Hence, hardware related problems arise, such as increased demand for large-scale special cooling equipment and decreased reliability of vacuum sealant. Also anticipated is that additional time taken to cool the wafer below a room temperature and heat it back to the room temperature leads to a reduction in throughput as well as economy and productivity.

OBJECTS AND SUMMARY OF THE INVENTION

The object of the present invention is to provide a practical dry etching method for etching a polycide film whereby such problems as difficulty in deciding the timing for a change in the two-stage etching, pollution due to carbonaceous polymers and a decline in selectivity, and troubles caused by low-temperature control of the wafer can be solved.

The points of the dry etching method of the present invention are as follows: 1) fluorine based compounds are not used as components of the etching gas; 2) sidewall protection is performed with substances other than carbonaceous polymers; and 3) one-stage etching is realized without changing etching conditions during the process.

First, in the present invention, Cl* and/or Br* are used for etching instead of F*, which causes a decline in anisotropy. In the prior art Cl* and Br* are not positively used because of low vapor pressure of chlorides and bromides of W. For instance, the boiling points of $WCl_5$, $WCl_6$ and $WBr_6$ are 275.6° C., 346.7° C. and 232° C., respectively, and these boiling points are higher than that of $WF_6$, which is in a gaseous state at a normal temperature. From a different point of view, however, it can be considered that if a wafer is heated to some extent under reduced pressure for etching, a compound having the boiling point at the above-mentioned level obtains vapor pressure necessary for elimination, thereby promoting etching sufficiently.

Meanwhile, having noticed advantages of sulfur (S) and sulfur nitride based compounds, the present inventor has made a number of proposals on sidewall protection substances other than carbonaceous polymers.

S may be formed by using a compound which can release free S in a plasma when dissociated by electric discharges, as reported in the Monthly Journal "Semiconductor World," published by the Press Journal Inc., January 1993, p. 140-144. The deposited S can be removed through sublimation if the etched wafer is heated to approximately 90° C. or above.

Sulfur nitride based compounds can be formed in a similar manner if a nitrogen based compound is added to a compound which can produce S, as proposed by the present inventor before. The sulfur nitride compound formed in this process is mainly polythiazyl $(SN)_x$, and the following description centers on $(SN)_x$. Although there is a possibility that thiazyl halide and hydrogen thiazyl other than $(SN)_x$ may be formed in accordance with composition of etching gas, all these compounds can be easily removed through sublimation or decomposition if the wafer is heated to approximately 130° C. or above.

Accordingly, the wafer is heated on the assumption of such a temperature range that these S and sulfur nitride based compounds cannot be removed.

The preceding is a common idea to the four aspects of the present invention.

The sulfur deposition process can be realized by using at least one of compounds which can simultaneously supply S and Cl*, or S and Br*, from one molecule as a main component of the etching gas. Typical of such compounds are sulfur chlorides, for instance, $S_3Cl_2$, $S_2Cl_2$ and $SCl_2$, or sulfur bromides such as $S_3Br_2$, $S_2Br_2$ and $SBr_2$. Cl* and Br* contribute to etching of the polycide film as etchants, and S as sidewall protection a substance.

On the other hand, the sulfur nitride deposition process can be realized by further adding a nitrogen based compound to the etching gas containing at least either sulfur chlorides or sulfur bromides. In this case, when S formed through dissociation from sulfur chlorides and/or sulfur bromides and N formed through dissociation from nitrogen based compounds react with each other, thiazyl (N≡S) is formed first, and then the formed thiazyl performs nucleophilic attack by using unpaired elect,tons, so that the molecules easily polymerize to form $(SN)_2$, $(SN)_4$ and furthermore, polythiazyl $(SN)_x$. $(SN)_x$ in a crystalline state has a structure wherein covalent, bond chains, S—N—S—N— ..., are arranged in parallel with each other, as described in J. Am. Chem. Soc., Vol. 29, 1975, p. 6358–6363. This polymer exhibits high resistance to the attack of radicals and ions, and therefore, demonstrates stronger sidewall protection effects than sulfur.

Meanwhile the above-mentioned $S_2Cl_2$ (disulfur dlchloride) has a melting point of −77° C. and a boiling point of 138° C., and the $S_2Br_2$ (disulfur dibromide) has a melting point, of −46° C. and a boiling point, of 54° C. ($2.39 \times 10^3$ Pa), both of which are liquid or oily substances at a normal temperature and under normal pressure. When vaporized by such a method as bubbling by using inactive gas and introduced into an etching chamber, these substances can be used as etching gas even with single composition.

However, the present invent, or has found it possible to change the state of plasma by mixing both of these compounds in advance before vaporizing, and thus to supply a greater variety of chemical species to the etching reaction system. This is because $S_2ClBr$ (sulfur chloride bromide) is partly formed by a halogen exchange reaction between $S_2Cl_2$ and $S_2Br_2$. Chemical species such as $SClBr^+$ and $ClBr^+$ which cannot be formed from etching gas with single composition of $S_2Cl_2$ or $S_2Br_2$ may be formed from $S_2ClBr$, and also, efficiency in dissociation by electric discharges changes.

In the present application, liquid sulfur halide is limited to the two above-mentioned substances as a matter of convenience. Among sulfur halide, however, there are many compounds having other atomic composition ratios with uncertain presence and characteristics in a pure state. Theoretically, it is possible to obtain similar mixed gas products even by using these uncertain compounds.

Meanwhile, as an example of a change in etching characteristics by a halogen exchange reaction of two-component gas, it is known that selectivity for resist improves by supplying $BCl_3$ and $BBr_3$ mixed in advance, in etching an aluminum based material layer. The present invention is based on this fact. Although detailed mechanism of this improvement in selectivity is not made clear, it is considered that high resistance to sputtering operation of ions and attacks of radicals can be given by complicating and diversifying the structure and properties of a $CCl_xBr_y$ based polymer formed on the surface of a resist mask.

As is clear from the above description, according to the dry etching method of the present invention, the one-stage etching for the polycide film which was conventionally difficult can be realized without using a CFC gas. This brakes a path to etching of the polycide film formed on the substrate having large steps. Particularly, in a system using single-composition etching gas, controllability of etching can be significantly improved. Besides, since the etching gas contains no carbon, selectivity for the $SiO_2$ based underlying layer can be improved, and particle pollution can be prevented.

Accordingly, the present invention is highly suitable for production of semiconductor devices demanding high integration, high performance and high reliability, and is designed on the basis of minute rules.

BRIEF DESCRIPTION OF THE DRAWINGS

FIG. 1a shows a state in which a resist mask is formed on a W-polycide film. FIG. 1b shows a state in which the W-polycide film is etched while sidewall protection films are formed by deposition of S. FIG. 1c shows a state in which the sidewall protection films are removed, FIG. 1d shows a state in which the resist mask is removed.

FIG. 2a shows a state in which a resist mask is formed on a W-polycide film via a TiON antireflection film. FIG. 2b shows a state in which a TiON antireflection film pattern is formed and then the resist mask is removed. FIG. 2c shows a state in which the W-polycide film is etched with the TiON antireflection film pattern formed thereon as a mask. FIG. 2d shows a state in which sidewall protection films and a sulfur nitride based deposition layer is removed.

DETAILED DESCRIPTION OF THE INVENTION

Referring to drawings, preferred embodiments of the present invention are described hereinafter.

EXAMPLE 1

In this example, a method according to the present invention is applied to a gate electrode forming process wherein a W-polycide film was etched by using a $S_2Cl_2$ gas. The process is described by referring to FIGS. 1a to 1d.

Figure 1A:
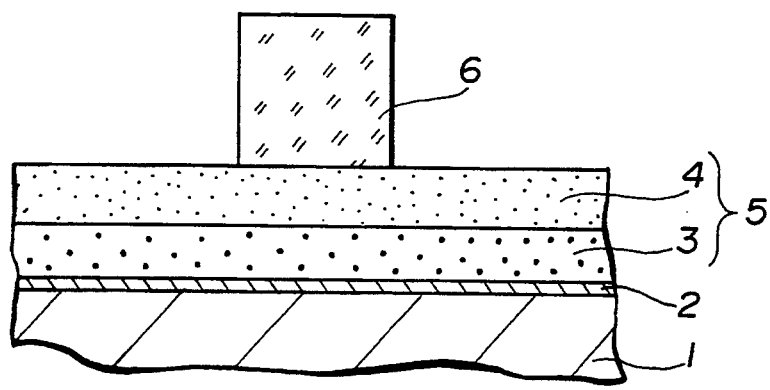
FIGS. 1a to 1d are schematic cross-sectional views showing an example of application of the present invention to a gate electrode forming process in order.

A wafer was prepared, being composed of a W-polycide film 5 formed on a single-crystal silicon substrate 1 via a gate oxide film 2, and a resist mask 6 patterned in a predetermined shape and formed thereon, as shown in FIG. 1a. The W-polycide film 5 was composed of a polysilicon layer 3 and a $WSi_x$ layer 4 stacked in this order, the polysilicon layer 3 having a thickness of about 100 nm with n-type impurities doped therein and the $WSi_x$ layer 4 having a thickness of about 100 nm. The resist mask 6 was patterned in a width of about 0.35 $\mu$m by performing KrF excimer laser lithography by using, for example, a negative three-component chemical amplification photoresist material, supplied by Shipley Co., Ltd.; product name SAL-601.

This wafer was set on an RF-biased magnetically enhanced microwave plasma etcher, and the W-polycide film 5 thereon was etched, for instance, under the following conditions:

$S_2Cl_2$ flow rate 50 SCCM
gas pressure 1.3 Pa (10 mTorr)
microwave power 850 W (2.45 GHz)
RF bias power 50 W (2 MHz)
wafer temperature 80° C.

In this state, the $S_2Cl_2$, which is a liquid substance at a normal temperature, is vaporized by bubbling with an He gas and then introduced into an etching chamber.

Figure 1B:
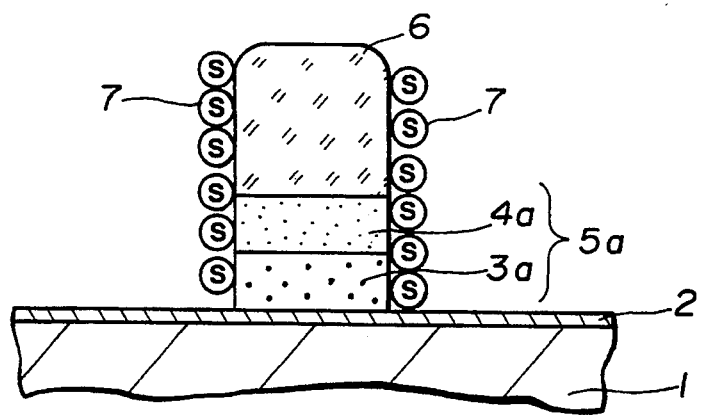

In this process, Cl* reacted with assistance of such ions as $S_x^+$, $SCl_x^+$ and $Cl_x^+$ to promote etching. A reaction product $WCl_x$ formed in etching the $WSi_x$ layer 4 is a compound with a high boiling point. Since the wafer was heated to 80° C. in the above-mentioned high vacuum state, the reaction product obtained vapor pressure sufficient for elimination, and therefore generated no particle pollution. In a plasma, free S was dissociated from $S_2Cl_2$, and formed sidewall protection films 7, as shown in FIG. 1b. With the assistance effects of ions and sidewall protection effects, a gate electrode 5a having a highly anisotropic shape even in one-stage etching was formed. In the drawings, a pattern of each material layer formed after etching is indicated by an original number with letter "a" added thereto.

Meanwhile, conventionally, there is a fear of a decline in selectivity for the resist mask 6 under these heated conditions. In the present invention, however, since an S deposition process and a sputtering process compete with each other on the surface of the resist mask 6, selectivity for resist did not decline.

Also, in the present example, since etching gas did not contain carbon, selectivity of 50 or higher for the gate oxide film 2 was secured, unlike in a conventional process using CFC gas.

Figure 1C:
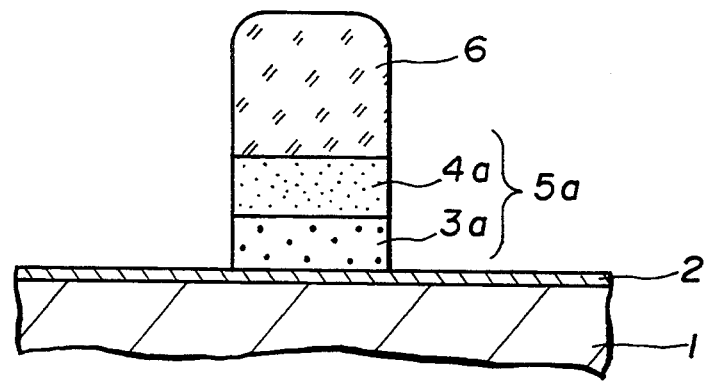

When the wafer was heated to about 100° C. after etching, the sidewall protection films 7 were easily removed through sublimation, as shown in FIG. 1c, and no particle pollution was generated on the wafer.

Figure 1D:
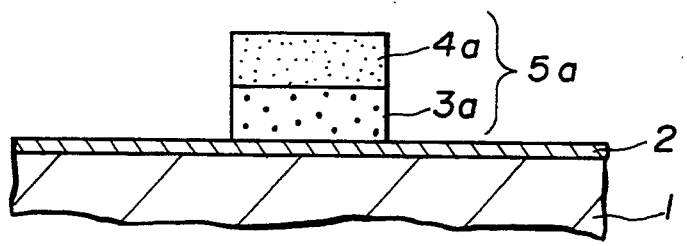

Finally, the resist mask 6 was removed by $O_2$ plasma ashing in accordance with conventional conditions, as shown in FIG. 1d. According to this ashing process, remaining small amount of S, if any, can be perfectly removed in the form of $SO_x$.

Meanwhile, the sidewall protection films 7 may be removed simultaneously with the resist mask 6.

EXAMPLE 2

In this example, a W-polycide film was etched by using an $S_2Cl_2/S_2Br_2$ mixed gas.

First, a wafer shown in FIG. 1a was set on a magnetically enhanced microwave plasma etcher, and a W-polycide film 5 thereon was etched, for instance, under the following conditions:

$S_2Cl_2$ flow rate 25 SCCM
$S_2Br_2$ flow rate 25 SCCM
gas pressure 1.3 Pa (10 mTorr)
microwave power 850 W (2.45 GHz)

RF bias power 50 W (2 MHz)
wafer temperature 80° C.

In this state, $S_2Br_2$, which is a liquid substance at an ordinary temperature, was vaporized by bubbling and then introduced into an etching chamber, like $S_2Cl_2$.

In this process, $Cl^*$ and $Br^*$ reacted with assistance of incident energy of such ions as $S_x^+$, $SCl_x^+$, $SBr_x^+$, $Cl_x^+$ and $Br_x^+$ to promote etching. Since the wafer was heated, reaction products $WCl_x$ and $WBr_x$ formed in etching a $WSi_x$ layer 4 were eliminable. The mechanism of sidewall protection with S is as described above in Example 1.

According to the present example as well, a gate electrode 5a having a highly anisotropic shape was formed by one-stage etching.

EXAMPLE 3

In this example, a patterned TiON layer formed as an antireflection film on a W-polycide film was used as an etching mask, and $S_2Br_2$ was used as an etching gas. The process is described by referring to FIGS. 2a to 2d, wherein numerals are partly common to FIGS. 1a to 1d.

Figure 2A:
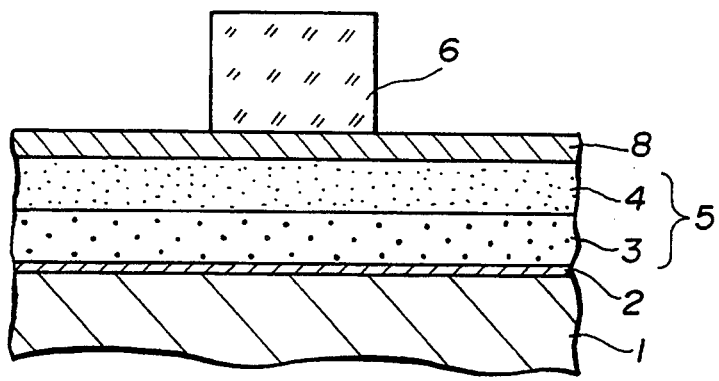
FIGS. 2a to 2d are schematic cross-sectional views showing another example of application of the present invention to a gate electrode forming process in order.

FIG. 2a shows a wafer before etching. Unlike the wafer previously shown in FIG. 1a, this wafer is composed of a TiON antireflection film 8 having a thickness of about 40 nm formed on the surface of a W-polycide film 5 by reactive sputtering. Because of the presence of the TiON antireflection film 8, a resist mask 6 is exempt from effects of a strong reflection light from a $WSi_x$ layer 4, and is patterned in a highly anisotropic shape.

First, the wafer was set on a magnetron RIE apparatus, and the TiON antireflection film 8 was etched, for instance, under the following conditions:
c-$C_4F_8$ flow rate 30 SCCM
$O_2$ flow rate 20 SCCM
gas pressure 1.3 Pa (10 mTorr)
microwave power 850 W (2.45 GHz)
RF bias power 1000 W (13.56 MHz)

The above-mentioned c-$C_4F_8$ (octafluorocyclobutane) is one of so-called fluorocarbon compounds of higher order, and contributes to high-rate etching with assistance of ions by forming a plurality of $CF_x^+$ from one molecule. The TiON antireflection film 8 was removed by this etching in the form of $TiO_xF_y$.

Figure 2B:
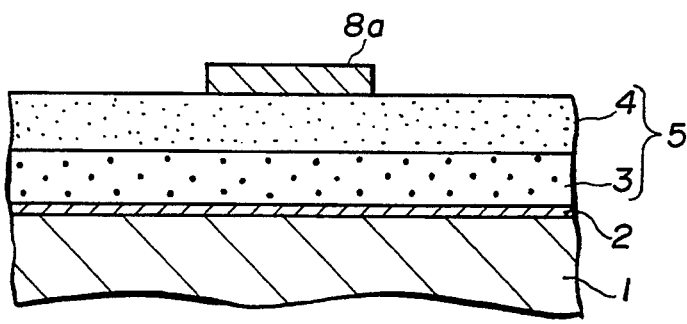

Furthermore, the wafer was moved onto a plasma asher, and the resist mask 6 was removed under the conditions of the conventional $O_2$ plasma ashing, whereby the TiON antireflection film pattern 8a was formed, as shown in FIG. 2b. In other words, the TiON antireflection film 8 which had been used as the antireflection film was then used as the etching mask.

Next, the wafer was set on the magnetically enhanced microwave plasma etcher, and the W-polycide film 5 thereon was etched, for instance, under the following conditions:
$S_2Br_2$ flow rate 50 SCCM
gas pressure 1.3 Pa (10 mTorr)
microwave power 850 W (2.45 GHz)
RF bias power 50 W (2 MHz)
wafer temperature 80° C.

Figure 2C:
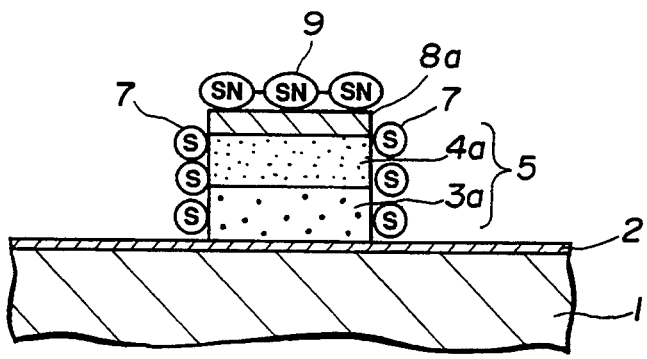
Figure 2D:
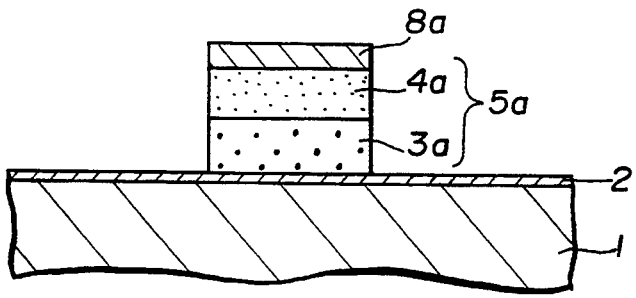

The mechanism of etching the W-polycide film 5 in this process is substantially identical to the mechanism in Example 1 with the use of bromine instead of chlorine. With this mechanism of etching, a gate electrode 5a having a highly anisotropic shape was formed, as shown in FIG. 2c. Since reaction products $WBr_x$ in this case had higher vapor pressure than $WCl_x$, the etchrate improved compared with Example 1.

Sidewall protection films 7 were formed on pattern sidewalls by depositing S produced through dissociation from $S_2Br_2$. On the surface of a TiON antireflection film pattern 8a, Ti atoms were extracted by action of $Br^*$ in a plasma while a dangling bond of N was formed. This dangling bond is combined with S in the plasma, thereby forming a sulfur nitride based deposition layer 9. FIG. 2c schematically shows a state of polythiazyl $(SN)_x$ deposition. The sulfur nitride based deposition layer 9 exhibited high resistance to attacks of incident ions and radicals, and enabled a thin TiON antireflection film pattern 8a to function as the etching mask.

Next, when the wafer is heated to about 150° C., the sidewall protection films 7 composed of S and the sulfur nitride based deposition layer 9 composed of $(SN)_x$ were removed through sublimation or decomposition.

If $O_2$ plasma processing is performed under conditions of ordinary $O_2$ plasma ashing instead of heating the wafer, it is possible to remove the sidewall protection films 7 and the sulfur nitride based deposition layer 9 in a similar manner.

Meanwhile, in this example, the etching gas did not contain carbon, and the resist mask was not used at the time of etching the W-polycide film 5. Therefore, selectivity for a gate oxide film 2 improved further than in Example 1 to 100 or higher.

The TiON antireflection film pattern 8a has a thickness one-fifth of the thickness of the gate electrode, and therefore can be left and used as part of an interlayer insulation film, without greatly expanding steps on the wafer surface.

EXAMPLE 4

In this example, a W-polycide film was etched by using an $S_2Cl_2/N_2$ mixed gas. The process is described by referring to FIG. 3.

A wafer used as an etching sample in this example is identical with the wafer previously shown in FIG. 1a. This wafer was set on the magnetically enhanced microwave plasma etcher, and a W-polycide film 5 thereon was etched, for example, under the following conditions:
$S_2Cl_2$ flow rate 50 SCCM
$N_2$ flow rate 20 SCCM
gas pressure 1.3 Pa (10 mTorr)
microwave power 850 W (2.45 GHz)
RF bias power 30 W (2 MHz)
wafer temperature 120° C.

Figure 3:
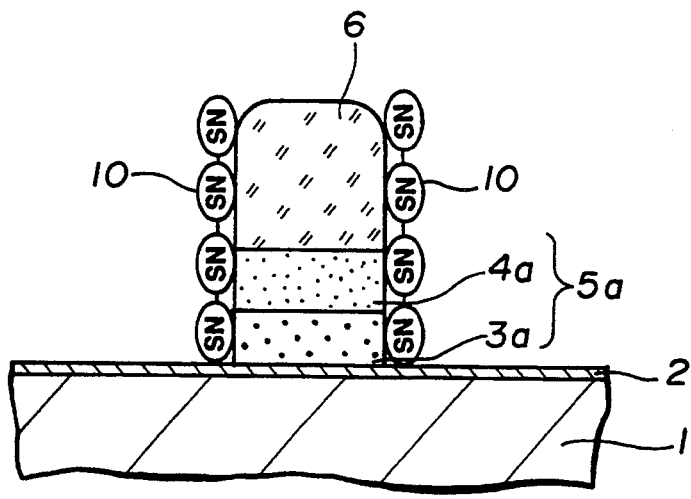
FIG. 3 is a schematic cross-sectional view showing a state wherein the sidewall protection films are formed by depositing sulfur nitride based compounds in the example shown in FIGS. 2a to 2d of application of the present invention to the gate electrode forming process.

The mechanism of etching the W-polycide film 5 in this process is substantially identical with the etching mechanism of Example 1. In the present example, however, at least part of S formed in a gaseous phase further reacted with $N_2$, thereby forming sulfur nitride based compounds. The sulfur nitride based compounds were deposited on sidewalls of a pattern, and formed sidewall protection films 10, as shown in FIG. 3. Since the sidewall protection effect of the sulfur nitride based compounds was stronger than that of S, a gate electrode 5a having a highly anisotropic shape was formed, despite lower RF bias power than in Example 1.

EXAMPLE 6

In this example, a W-polycide film was etched by using an $S_2Cl_2/S_2Br_2/N_2$ mixed gas.

In this example, a wafer as shown in FIG. 1a was used, and a W-polycide film 5 thereon was etched, for instance, under the following conditions:
$S_2Cl_2$ flow rate 25 SCCM $S_2Br_2$ flow rate 25 SCCM
$N_2$ flow rate 20 SCCM
gas pressure 1.3 Pa (10 mTorr)
microwave power 850 W (2.45 GHz)
RF bias power 30 W (2 MHz)
wafer temperature 120° C.

The mechanism of etching the W-polycide film 5 in this process is substantially identical with the etching mechanism of Example 2. In the present example, however, at least part of S formed in a gaseous phase further reacted with $N_2$, thereby forming sulfur nitride based compounds. The sulfur nitride based compounds were deposited on sidewalls of a pattern, and formed sidewall protection films 10, as shown in FIG. 3.

EXAMPLE 6

In this example, a W-polycide film 5 was etched by using an $S_2Br_2/N_2$ mixed gas, with a TiON antireflection film used as an etching mask. The process is described by referring to FIG. 4.

In this example, a wafer as shown in FIG. 2a was used, and the W-polycide film 5 thereon was etched, for instance, under the following conditions:

$S_2Br_2$ flow rate 50 SCCM
$N_2$ flow rate 20 SCCM
gas pressure 1.3 Pa (10 mTorr)
microwave power 850 W (2.45 GHz)
RF bias power 30 W (2 MHz)
wafer temperature 120° C.

Figure 4:
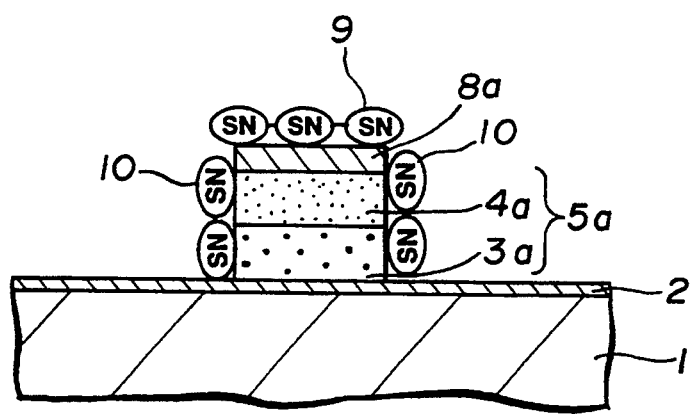
FIG. 4 is a schematic cross-sectional view showing a state wherein sidewall protection films and a sulfur nitride based deposition layer are formed by depositing sulfur nitride compounds in still another example of application of the present invention to a gate electrode forming process.

The mechanism of etching the W-polycide film 5 in this process is substantially identical with the mechanism of Example 3. In the present example, however, at least part of S formed in a gaseous phase further reacted with $N_2$, thereby forming sulfur nitride compounds. The sulfur nitride compounds were deposited on sidewalls of a pattern, and formed sidewall protection films 10, as shown in FIG. 4.

EXAMPLE 7

In the present example, wherein a W-polycide film was etched by using a mixed gasified product of $S_2Cl_2$ and $S_2Br_2$.

First, a wafer as shown in FIG. 1a was used, and a W-polycide film 5 thereof was etched, for instance, under the following conditions:

$(S_2Cl_2+S_2Br_2)$ flow rate 50 SCCM
gas pressure 1.3 Pa (10 mTorr)
microwave power 850 W (2.45 GHz)
RF bias power 50 W (2 MHz)
wafer temperature 80° C.

The $(S_2Cl_2+S_2Br_2)$ flow rate represents a flow rate of the mixed gas product obtained by mixing 50 grams each of liquid $S_2Cl_2$ and $S_2Br_2$ in a gas cylinder with a capacity of one liter, and then vaporizing the mixture. The mixed gasified product contains $S_2ClBr$, which is a halogen exchange reaction product, at a predetermined ratio.

At this time, a greater variety of etchants than in Example 2 were formed in the etching reaction system. Namely, W and Si were extracted by Cl* and Br* with assistance of such ions as $S_x^+$, $SCl_x^+$, $SBr_x^+$, $Cl_x^+$, $Br_x^+$ and $ClBr^+$ to promote etching. Also in this example, highly anisotropic processing was performed while forming sidewall protection films 7 of S. In addition, selectivity for a resist mask 6 improved by complicating composition of polymers formed on the surface of the resist mask 6.

EXAMPLE 8

In the present example, a W-polycide film was etched by using an $(S_2Cl_2+S_2Br_2)/N_2$ mixed gas.

First, a wafer as shown in FIG. 1a was used, and a W-polycide film 5 thereon was etched, for instance, under the following conditions:

$(S_2Cl_2+S_2Br_2)$ flow rate 50 SCCM
$N_2$ flow rate 20 SCCM
gas pressure 1.3 Pa (10 mTorr)
microwave power 850 W (2.45 GHz)
RF bias power 30 W (2 MHz)
wafer temperature 80° C.

The etching mechanism in this process is substantially identical with the mechanism described in Example 7. In the present example, however, at least part of S released from the mixed gas product reacted with $N_2$ in a gaseous phase, thereby forming sulfur nitride based compounds such as $(SN)_x$, which contributed to sidewall protection. Since the sidewall protection effect of the sulfur nitride based compounds was much stronger than that of S, highly anisotropic processing was realized, despite the lower RF bias power than in Example 7.

The present invention is described on the basis of the above eight working examples. However, the present invention is not limited to these examples. For instance, $N_2H_2$, $NF_3$, $NCl_3$, $NBr_3$ and $NO_2$ can be used as a nitrogen based compound other than the above-mentioned $N_2$. $NH_3$ reacts with sulfur halide to form ammonium sulfides as by-products which are difficult to remove, and therefore is not desirable.

Also, various types of additional gases may be mixed into the etching gas. For example, if a gas such as an $H_2$, $H_2S$ or silane based gas which can supply $H^*$ and $Si^*$ in the etching system is added, these radicals capture excessive halogen radicals, thereby improving the deposition effect of S. In addition, a rare gas may be added in order to obtain sputtering, cooling and dilution effects.

The antireflection film on the W-polycide film may be composed of $Si_xN_y$ other than the above-mentioned TiON.

The refractory metal silicide layer may be a $MoSi_x$ layer, a $TiSi_x$ layer or a $TaSi_x$ layer other than the above-mentioned $WSi_x$ layer.

Needless to say, etching conditions and the structure of the wafer can be changed as a matter of convenience.

What is claimed is:

1. A dry etching method for etching a polycide film formed on a substrate, said method comprising:
   carrying out a plasma etching using an etching gas containing a gas capable of releasing free sulfur into a plasma under conditions of discharge dissociation, and while performing the plasma etching, heating the substrate at a temperature capable of depositing a protection film of sulfur on a sidewall of the polycide film.

2. The dry etching method as claimed in claim 1 wherein said etching gas contains at least one type of sulfur halide selected from the group consisting of $SCl_2$, $S_2Cl_2$, $S_3Cl_2$, $SBr_2$, $S_2Br_2$, and $S_3Br_2$.

3. A dry etching method according to claim 1, wherein said heating is at a temperature not more than 90° C. and subsequent to plasma etching heating the substrate to above 90° C. to remove the sulfur protection film.

4. A dry etching method according to claim 1, wherein said polycide film comprises a polysilicon layer and a refractory metal silicide layer stacked on the polysilicon layer, and said refractory metal silicide layer is selected from the group consisting of a tungsten silicide layer, a titanium silicide layer, a molybdenum silicide layer, and a tantalum silicide layer.

5. The dry etching method as claimed in claim 1 wherein said etching is carried out by using a nitrogen-containing material pattern as a mask, while depositing sulfur nitride based compounds on a surface of said nitrogen-containing material pattern.

6. The dry etching method as claimed in claim 1 wherein said etching is carried out by using a titanium nitride based anti-reflection film pattern as a mask, while depositing sulfur nitride based compounds on a surface of said titanium nitride based anti-reflection film pattern.

7. The dry etching method as claimed in claim 1 wherein said etching is carried out by using a resist pattern as a mask, and wherein the sulfur deposited on said substrate is combusted for removal by performing ashing on said resist pattern after the etching.

8. A dry etching method for etching a polycide film formed on a substrate, said method comprising:
carrying out a plasma etching using an etching gas containing a gas capable of releasing free sulfur into a plasma under conditions of discharge dissociation, and a nitrogen-based gas; and
heating the substrate during plasma etching at a temperature capable of depositing a protection film of sulfur nitride on a sidewall of the polycide film.

9. The dry etching method as claimed in claim 8 wherein said etching gas contains at least one type of sulfur halide selected from the group consisting of $SCl_2$, $S_2Cl_2$, $S_3Cl_2$, $SBr_2$, $S_2Br_2$, and $S_3Br_2$, and at least on type of nitrogen based compound selected from the group consisting of $N_2$, $N_2H_2$, $NF_3$, $NCl_3$, $NBr_3$, and $NO_2$.

10. A dry etching method as claimed in claim 8, wherein said heating is performed at the temperature of 130° C. or below, and subsequent to plasma etching, heating the substrate at a temperature higher than 130° C. to remove the protection film of sulfur nitride.

11. The dry etching method according to claim 8, wherein said polycide film comprises a polysilicon layer and a refractory metal silicide layer on the polysilicon layer, and said refractory metal silicide layer is selected from the group consisting of a tungsten silicide layer, a titanium silicide layer, a molybdenum silicide layer, and a tantalum silicide layer.

12. The dry etching method as claimed in claim 8 wherein said etching is carried out by using a nitrogen-containing material pattern as a mask.

13. The dry etching method as claimed in claim 8 wherein said etching is carried out by using a titanium nitride based anti-reflection film pattern as a mask, while depositing sulfur nitride based compounds on a surface of said titanium nitride based anti-reflection film pattern.

14. The dry etching method as claimed in claim 8 wherein said etching is carried out by using a resist pattern as a mask, and wherein the sulfur nitride based compounds deposited during the etching is combusted for removal by performing ashing on said resist pattern after the etching.

15. A dry etching method for etching a polycide film formed on a substrate, said dry etching method comprising,
carrying out a plasma etching using an etching gas containing a gasified product of a mixture of $S_2Cl_2$ and $S_2Br_2$, and heating said substrate during the plasma etching within a temperature range allowing deposition of a protective film of sulfur on sidewalls of the polycide film.

16. A dry etching method according to claim 15, wherein said heating is performed at 90° C. or below, and subsequent to the plasma etching, the sulfur deposited is sublimited by heating the substrate at a temperature higher than 90° C.

17. The dry etching method as claimed in claim 15 wherein said polycide film is formed by a polysilicon layer and a refractory metal silicide layer thereon, and said refractory metal silicide layer is selected from the group consisting of a tungsten silicide layer, a titanium silicide layer, a molybdenum silicide layer, and a tantalum silicide layer.

18. The dry etching method as claimed in claim 15 wherein said etching is carried out by using a nitrogen-containing material pattern as a mask, while depositing sulfur nitride based compounds on a surface of said nitrogen-containing material pattern.

19. The dry etching method as claimed in claim 15 wherein said etching is carried out by using a titanium nitride based anti-reflection film pattern as a mask, while depositing sulfur nitride based compounds on a surface of said titanium nitride based anti-reflection film pattern.

20. The dry etching method as claimed in claim 15 wherein said etching is carried out by using a resist pattern as a mask, and wherein the sulfur deposited on said substrate is combusted for removal by performing ashing on said resist pattern after the etching.

21. A dry etching method for etching a polycide film formed on a substrate, said dry etching method comprising,
carrying out a plasma etching using an etching gas containing a gasified product of a mixture of $S_2Cl_2$ and $S_2Br_2$, and a nitrogen based compound, and heating said substrate during the plasma etching within a temperature range allowing deposition of a protective film of sulfur nitride based compounds on a sidewall of the polycide film.

22. A dry etching method according to claim 21, wherein said polycide film comprises a polysilicon layer and a refractory metal silicide layer stacked on the polysilicon layer, said refractory metal silicide layer being selected from the group consisting of a tungsten silicide layer, a titanium silicide layer, a molybdenum silicide layer, and a tantalum silicide layer.

23. The dry etching method as claimed in claim 21 wherein said etching is carried out while heating said substrate within a temperature range of up to 130° C., and wherein the sulfur nitride based compounds deposited during the etching is sublimated for removal by heating said substrate at a temperature higher than 130° C. after the etching.

24. A dry etching method according to claim 21, wherein said heating is performed at 130° C. or below, and subsequent to the plasma etching, the sulfur nitride is sublimited by heating the substrate at a temperature higher than 130° C. after etching.

25. The dry etching method as claimed in claim 21 wherein said etching is carried out by using a nitrogen-containing material pattern as a mask.

26. The dry etching method as claimed in claim 21 wherein said etching is carried out by using a titanium nitride based anti-reflection film pattern as a mask, while depositing sulfur nitride based compounds on a surface of said titanium nitride based anti-reflection film pattern.

27. The dry etching method as claimed in claim 21 wherein said etching is carried out by using a resist pattern as a mask, and wherein the sulfur nitride based compounds deposited during the etching is combusted for removal by performing ashing on said resist pattern after the etching.

* * * * *